US012751231B2

(12) United States Patent
Wang et al.

(10) Patent No.: US 12,751,231 B2
(45) Date of Patent: Sep. 29, 2026

(54) EDGE STRUCTURE OF SEMICONDUCTOR WAFER AND MANUFACTURING METHOD THEREOF

(71) Applicant: UNITED MICROELECTRONICS CORP., Hsin-Chu City (TW)

(72) Inventors: Yu-Ping Wang, Hsinchu City (TW); Chuan-Lan Lin, Chiayi City (TW); Chu-Fu Lin, Kaohsiung City (TW); Teng-Chuan Hu, Tainan City (TW); Kun-Ju Li, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 427 days.

(21) Appl. No.: 18/537,814

(22) Filed: Dec. 13, 2023

(65) Prior Publication Data

US 2025/0166997 A1 May 22, 2025

(30) Foreign Application Priority Data

Nov. 21, 2023 (TW) ................................. 112144895

(51) Int. Cl.

| | |
|---|---|
| ***H10P 54/92*** | (2026.01) |
| ***H10P 10/00*** | (2026.01) |
| ***H10P 50/24*** | (2026.01) |
| ***H10P 52/00*** | (2026.01) |
| ***H10P 54/00*** | (2026.01) |
| ***H10W 20/00*** | (2026.01) |
| ***H10W 80/00*** | (2026.01) |
| ***H10W 99/00*** | (2026.01) |
| *H10P 50/64* | (2026.01) |
| *H10W 42/00* | (2026.01) |
| *H10W 90/00* | (2026.01) |
| *H10W 90/24* | (2026.01) |

(52) U.S. Cl.

CPC ............ *H10P 54/922* (2026.01); *H10P 10/12* (2026.01); *H10P 50/242* (2026.01); *H10P 52/00* (2026.01); *H10P 54/00* (2026.01); *H10W 20/0242* (2026.01); *H10W 80/00* (2026.01); *H10W 99/00* (2026.01); *H10P 50/24* (2026.01); *H10P 50/642* (2026.01); *H10W 42/121* (2026.01); *H10W 90/24* (2026.01); *H10W 90/792* (2026.01)

(58) Field of Classification Search

CPC ... H10W 42/121; H10W 80/00; H10W 99/00; H10P 52/00; H10P 54/00; H10P 54/20; H10P 54/30; H10P 54/40; H10P 54/922; H10P 10/12

See application file for complete search history.

(56) References Cited

U.S. PATENT DOCUMENTS 11,152,276 B2 * 10/2021 Li ........................ H10W 74/141
2012/0319215 A1 * 12/2012 Wang .................. H10D 30/601
257/E21.409

(Continued)

*Primary Examiner* — Eliseo Ramos Feliciano
*Assistant Examiner* — Brad A Knudson
(74) *Attorney, Agent, or Firm* — Winston Hsu

(57) ABSTRACT

The invention provide an edge structure of a semiconductor wafer, which comprise a first substrate, an edge region and a device region are defined on that first substrate, a first material layer covers a first surface and a side surface of the edge region, and a second material layer covers the first material layer, the cross-sectional structure of the second material layer gradually decreases from the device region to the edge region.

16 Claims, 3 Drawing Sheets

(56) References Cited

U.S. PATENT DOCUMENTS

| | | | | |
|---|---|---|---|---|
| 2020/0006145 | A1* | 1/2020 | Li | H10D 84/038 |
| 2021/0091024 | A1* | 3/2021 | Uozumi | H10W 72/90 |
| 2022/0271023 | A1* | 8/2022 | Wu | H10P 54/00 |
| 2022/0375789 | A1* | 11/2022 | Huang | H10W 20/077 |
| 2023/0178446 | A1* | 6/2023 | Sung | H10P 72/74<br>438/455 |
| 2023/0402405 | A1* | 12/2023 | Huang | H10P 72/74 |

* cited by examiner

EDGE STRUCTURE OF SEMICONDUCTOR WAFER AND MANUFACTURING METHOD THEREOF

BACKGROUND OF THE INVENTION

1. Field of the Invention

The invention relates to the field of semiconductor manufacturing, in particular to a method for improving the quality at the wafer edge and reducing the wafer fracture after bonding.

2. Description of the Prior Art

With the progress of semiconductor technology, various semiconductor components are developing in the direction of miniaturization. In the current technology, the necessary components can be formed on two wafers respectively, and then the two wafers can be bonded to each other by using hybrid bond technology. In this way, the process difficulty can be effectively reduced and the device density can be improved.

However, there are still some shortcomings in hybrid bond technology, for example, the bonded wafer structure may face some difficulties in the subsequent process, which leads to the decline of the yield of the process, so this is also a problem that needs to be solved in this field at present.

SUMMARY OF THE INVENTION

The invention provide an edge structure of a semiconductor wafer, which comprise a first substrate, wherein an edge region and a device region are defined on that first substrate, a first material layer covers a first surface and a side surface of the edge region, a second material layer covers the first material layer, wherein the cross-sectional structure of the second material layer gradually decreases from the device region to the edge region.

The invention further provides a method for manufacturing an edge structure of a semiconductor wafer, which comprises the following steps: firstly, a first substrate is provided, a device region and an edge region are defined on the first substrate, and the first substrate comprises a first device layer. A second substrate is provided, the second substrate comprises a second device layer, the first device layer with the second device layer are face to face bonded to each other, and an edge cutting step is performed on the edge region, to remove part of the second substrate, and so as to form a first surface in the edge region of the first substrate. Afterwards, a first material layer and a second material layer are formed on the first surface, and an edge etching step is performed to remove part of the second material layer.

The invention is characterized in that at the edge of the bonded semiconductor structure, it is easy to break after cutting with a cutter. Therefore, the invention is characterized in that in addition to cutting the edge with a cutter, an edge etching step is additionally performed, and the edge etching step is chemically etched, so that a flatter edge contour can be formed, the probability of wafer breakage in the subsequent process can be greatly reduced, and the overall process yield can be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

In order to make the following easier to understand, readers can refer to the drawings and their detailed descriptions at the same time when reading the present invention. Through the specific embodiments in the present specification and referring to the corresponding drawings, the specific embodiments of the present invention will be explained in detail, and the working principle of the specific embodiments of the present invention will be expounded. In addition, for the sake of clarity, the features in the drawings may not be drawn to the actual scale, so the dimensions of some features in some drawings may be deliberately enlarged or reduced.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Although the present invention uses the terms first, second, third, etc. to describe elements, components, regions, layers, and/or sections, it should be understood that such elements, components, regions, layers, and/or sections should not be limited by such terms. These terms are only used to distinguish one element, component, region, layer and/or block from another element, component, region, layer and/or block. They do not imply or represent any previous ordinal number of the element, nor do they represent the arrangement order of one element and another element, or the order of manufacturing methods. Therefore, the first element, component, region, layer or block discussed below can also be referred to as the second element, component, region, layer or block without departing from the specific embodiments of the present invention.

The term "about" or "substantially" mentioned in the present invention usually means within 20% of a given value or range, such as within 10%, or within 5%, or within 3%, or within 2%, or within 1%, or within 0.5%. It should be noted that the quantity provided in the specification is approximate, that is, the meaning of "about" or "substantially" can still be implied without specifying "about" or "substantially".

The terms "coupling" and "electrical connection" mentioned in the present invention include any direct and indirect means of electrical connection. For example, if the first component is described as being coupled to the second component, it means that the first component can be directly electrically connected to the second component, or indirectly electrically connected to the second component through other devices or connecting means.

Although the invention of the present invention is described below by specific embodiments, the inventive principles of the present invention can also be applied to other embodiments. In addition, in order not to obscure the spirit of the present invention, specific details are omitted, and the omitted details are within the knowledge of those with ordinary knowledge in the technical field.

Figure 1:
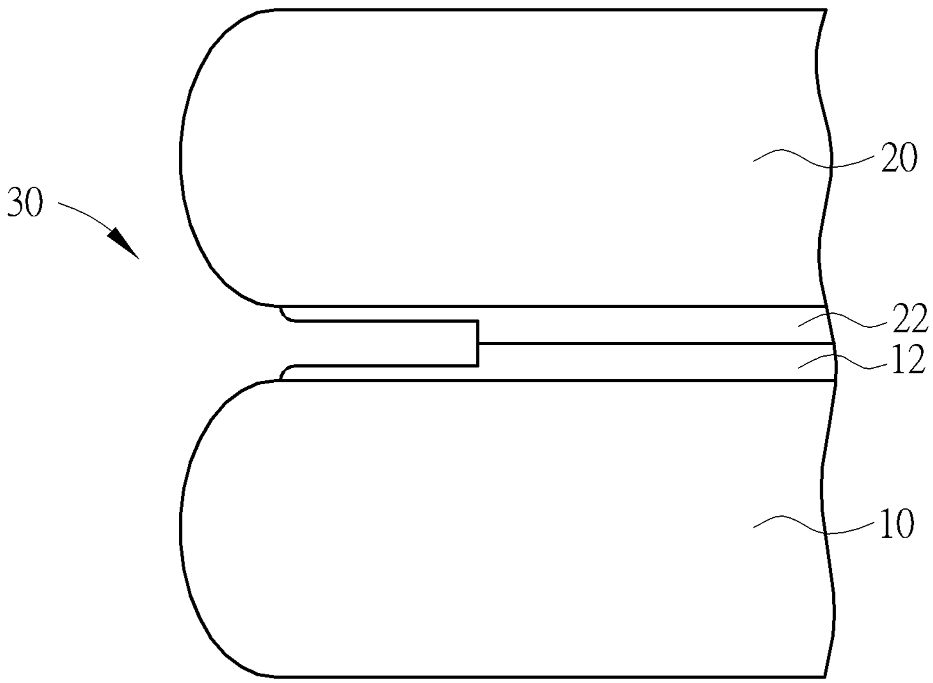
FIG. 1 shows the structure of two wafers bonded by hybrid bond technology, and the schematic diagram of the cross-sectional structure near the edge region.

Please refer to FIG. 1, which shows the structure of two wafers bonded by hybrid bond technology, and the schematic diagram of the cross-sectional structure near the edge region. First, two wafers are provided and are bonded to each other, the lower wafer comprises a first substrate 10 and the upper wafer comprises a second substrate 20, a first device layer 12 is formed on the first substrate 10, and a second device layer 22 is formed on the second substrate 20, and the bonded structure is defined as a bonded semiconductor structure 30. The first substrate 10 and the second substrate 20 described here are silicon substrates such as wafers, while the first device layer 12 and the second device layer 22 may contain various electronic elements, such as transistors, capacitors, inductors, memories, power amplifiers, multilayer dielectric layers and metal wires. A hybrid bond contact is formed at the top of the first device layer 12 and the second device layer 22, and the two hybrid bond structures can touch each other to bond two wafers. In other words, after most components of the lower wafer and the upper wafer (that is, the first device layer 12 and the second device layer 22) are completed, the upper wafer is turned upside down, and the respective hybrid bond structures of the lower wafer and the upper wafer touch each other, and the two wafers are bonded to each other. In this way, since most devices have been formed on the respective substrates of two wafers, compared with stacking multi-layer structures on single wafer, the process of semiconductor structure completed by hybrid bond technology is relatively simple, and the device density can also be greatly improved.

Figure 2:
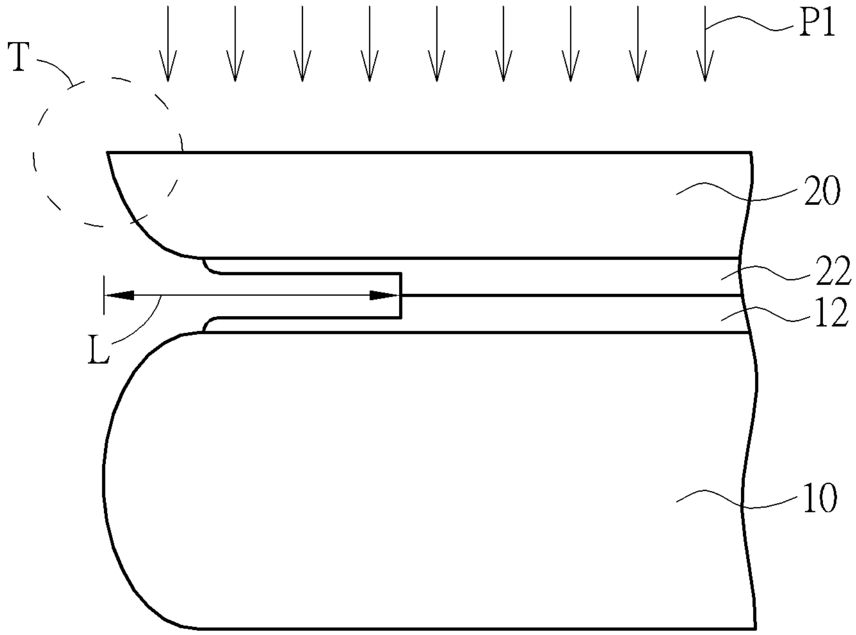
FIG. 2 is a schematic view of the structure according to FIG. 1 after a grinding step.

Then, as shown in FIG. 2, after the wafers are bonded to each other, aback circuit layer is scheduled to be formed on the bonded first device layer 12 and second device layer 22. The back circuit layer described here, for example, includes contact holes, conductor layers or contact pads, and is formed above and electrically connected with the bonded first device layer 12 and second device layer 22. The back circuit layer has the function of electrically connecting the bonded first device layer 12 and second device layer with other elements.

Figure 3:
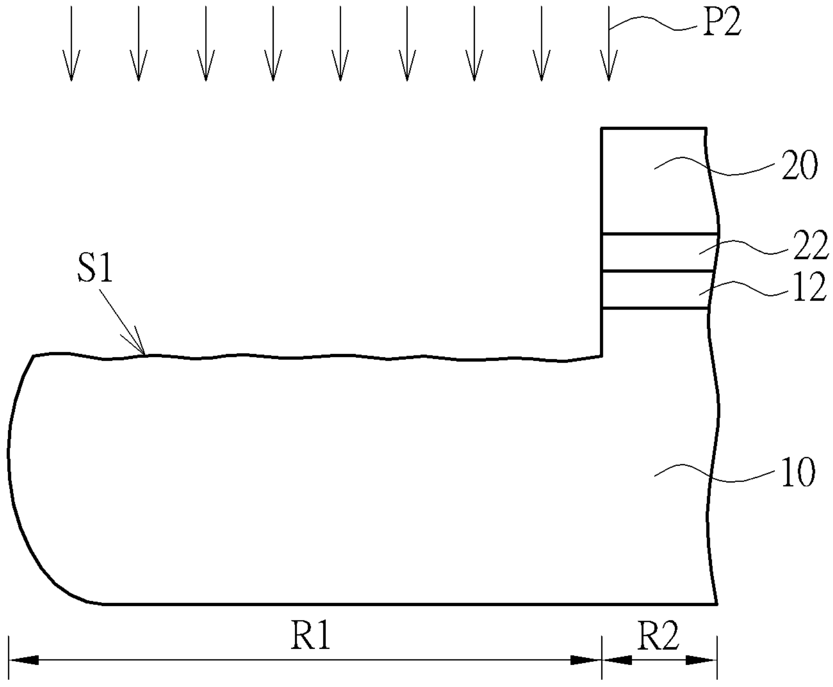
FIG. 3 is a schematic view after a cutting step according to the structure of FIG. 2.

Please continue to refer to FIG. 2 and FIG. 3. FIG. 2 shows the structure schematic diagram after a grinding step according to the structure of FIG. 1. FIG. 3 is a schematic structural view after a cutting step according to the structure of FIG. 2. In order to continue to form the back circuit layer, as shown in FIG. 2, a grinding step P1 will be performed to reduce the thickness of the second substrate 20 to a certain extent (for example, below 1000 microns, but not limited to this), so that the contact structure in the back circuit layer can penetrate through the second substrate 20 to electrically connect the first device layer 12 and the second device layer 22. However, if the second substrate 20 is only grinded by a grinding step P1 such as chemical mechanical polishing (CMP) and its thickness is reduced, after the grinding step P1 is performed, the second substrate 20 will produce a protruding corner portion T as shown in FIG. 2. This protruding corner portion T has a fragile structure and a large arm length (such as the length L in FIG. 2). If it exists in the structure, the protruding corner portion T will be easily broken during the subsequent process, and may even damage the second substrate.

Therefore, in order to avoid the existence of the protruding corner portion T in the structure and affect the yield of the process, as shown in FIG. 3, an edge cutting step P2 is performed to cut off the second substrate 20 in the edge region R1 of the semiconductor structure 30 by a physical cutting method (for example, cutting with a cutter). It is worth noting that the edge region R1 mentioned here refers to the area at the wafer edge, in which some components may be included, that is to say, the above-mentioned device layer may also extend into the edge region R1. However, since the edge region R1 will be subjected to the edge cutting step P2, these components will be removed together, so it can be understood that the components located in the edge region R1 are sacrificial components. The device region R2 is opposite to the edge region R1, and the device layers in the device region R2 will not be removed by the edge cutting step P2 in this step, so the components or devices in these device regions R2 will continue to be electrically connected with other components in the subsequent step.

After the edge cutting step P2, a first surface S1 is formed in the edge region R1, the first surface S1 is lower than the top surface T1 of the original first substrate 10. The first surface S1 is formed by a cutting step, which may have an uneven profile. The reason is that the edge cutting step P2 is physically cut by using a cutter, and the precision of the cutting step is rough, so the surface may be uneven after cutting. This uneven first surface S1 will gradually generate stress accumulation if material layers are stacked on it in the subsequent process, and when the stress accumulation is excessive, it may cause the first substrate 10 to crack.

Figure 4:
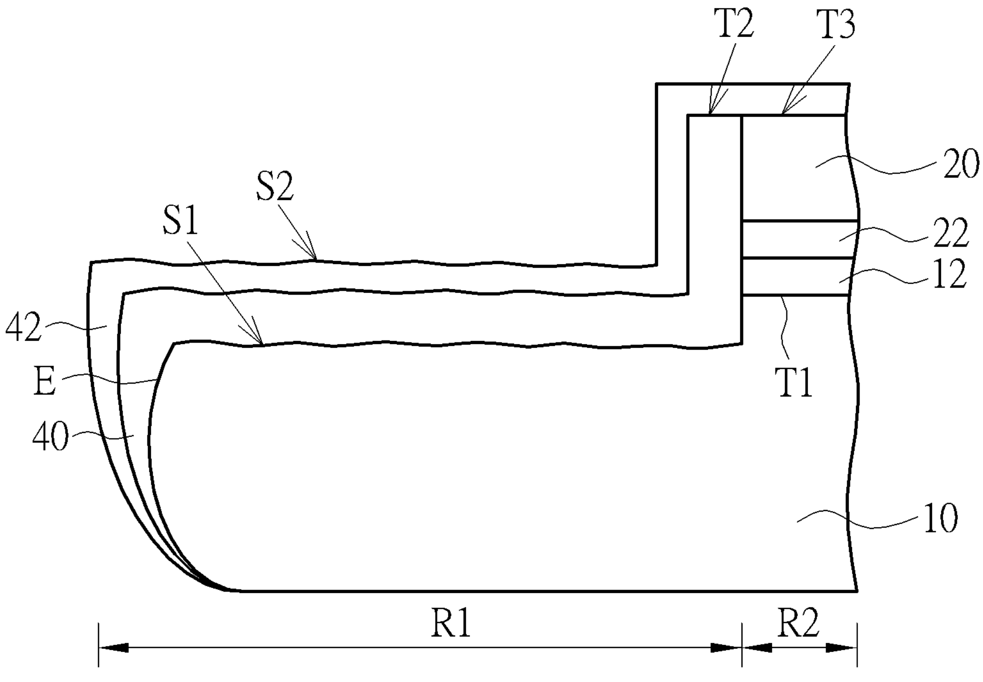
FIG. 4 is a schematic view of the structure according to FIG. 3 after a deposition step.

Please continue to refer to FIG. 4, which shows the structure schematic diagram after a deposition step according to the structure of FIG. 3. As shown in FIG. 4, a first material layer 40 and a second material layer 42 are continuously formed on the first substrate 10, the first material layer 40 is made of tetraethoxysilane (TEOS), and the second material layer 42 is made of silicon nitride, but not limited thereto. In addition, the first material layer 40 may cover the first surface S1 of the first substrate 10 and its edge side surface E, the sidewall of the first device layer 12 and the sidewall of the second device layer 22, and the top surface and the sidewall of the second substrate 20. However, after forming the first material layer 40, it further includes a grinding step (not shown) to remove the first material layer 40 on the top surface of the second substrate 20 in the device region R2, and then form the second material layer 42. Therefore, the second material layer 42 may be located directly on the top surface of the second substrate 20 in the device region R2 and on the top surface of the first material layer 40 in the edge region R1. In addition, the top surface T2 of the first material layer 40 is also aligned with the top surface T3 of the second substrate 20 in cross section.

The purpose of forming the first material layer 40 here is mainly to protect the edge side surface E of the first substrate 10, and the first material layer 40 covers part of the edge side surface E of the first substrate 10 to prevent it from being broken from the edge side surface E of the first substrate 10 due to the influence of subsequent processes, thus affecting the yield of the semiconductor structure. The main purpose of forming the second material layer 42 is to serve as the dielectric layer of the devices to be formed later, for example, structures such as contact structures, wire layers or conductive pads may be formed in the device region R2 later, which can be formed in the dielectric layer.

In addition, when the first surface S1 is formed, the first surface S1 may have an uneven profile, so this uneven profile will also affect the first material layer 40 and the second material layer 42 formed above the first surface S1, thus causing a second surface S2 of the second material layer 42 to also have an uneven profile.

Figure 5:
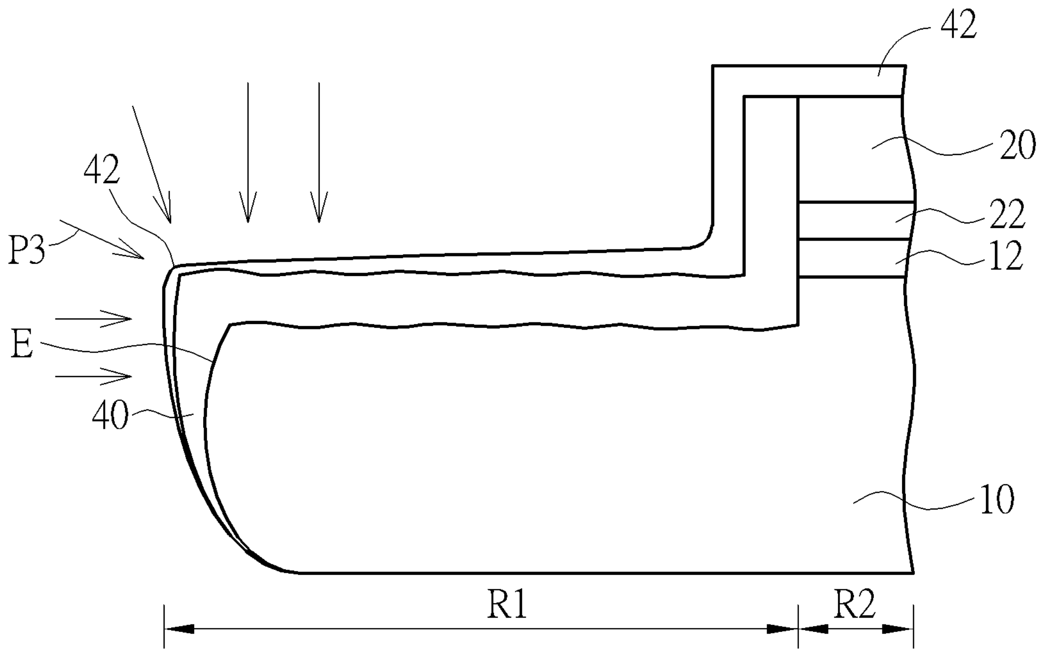
FIG. 5 is a schematic view of the structure according to FIG. 4 after an edge etching step.

The applicant found that the existence of the above-mentioned uneven contour surface will increase the probability of the first substrate 10 being broken when stacking components in the following period. Therefore, in the present invention, an additional edge etching step is performed to flatten the uneven contour of the second surface S2. Please refer to FIG. 5, which shows the structure schematic diagram after an edge etching step according to the structure of FIG. 4. As shown in FIG. 5, an edge etching step P3 is performed, in which in this embodiment, for example, sulfur hexafluoride ($SF_6$) is used for dry etching first, and then diluted hydrofluoric acid (DHF) is used for cleaning, and the total time is about 30 seconds, but it is not limited to this. The edge etching P3 is etched by chemical solvent, so the element fineness after etching will be higher than that of the physical cutting in FIG. 3. In addition, after etching, the cross-sectional structure of the second material layer 42 in the edge region R1 in the direction from the center to the edge (that is, the direction from the device region R2 to the edge region R1) gradually becomes thinner, that is, the thickness of the second material layer 42 gradually becomes thinner from the center of the wafer to the edge. This gradually thinning cross-sectional structure is smoother, which has a better protection effect on the wafer edge, and it is not easy for the wafer to break caused by the raised sharp corners.

In addition, according to the experimental results of the applicant, the roughness of the surface of the second material layer 42 near the edge of the semiconductor structure formed by this step is obviously reduced, thus effectively reducing the probability of wafer breakage in the subsequent process and improving the yield of the overall semiconductor process.

It is worth noting that in this embodiment, as shown in FIG. 5, after the edge etching step P3 is completed, a small part of the second material layer 42 may still cover the side of the first material layer 40, that is, the surface of the first material layer 40 corresponding to the edge side surface E. Or in other embodiments, if the etching parameters are adjusted, the second material layer 42 covering the sidewall of the first material layer 40 may be completely removed, that is, the sidewall of the first material layer 40 is exposed, which is also within the scope of the present invention.

Figure 6:
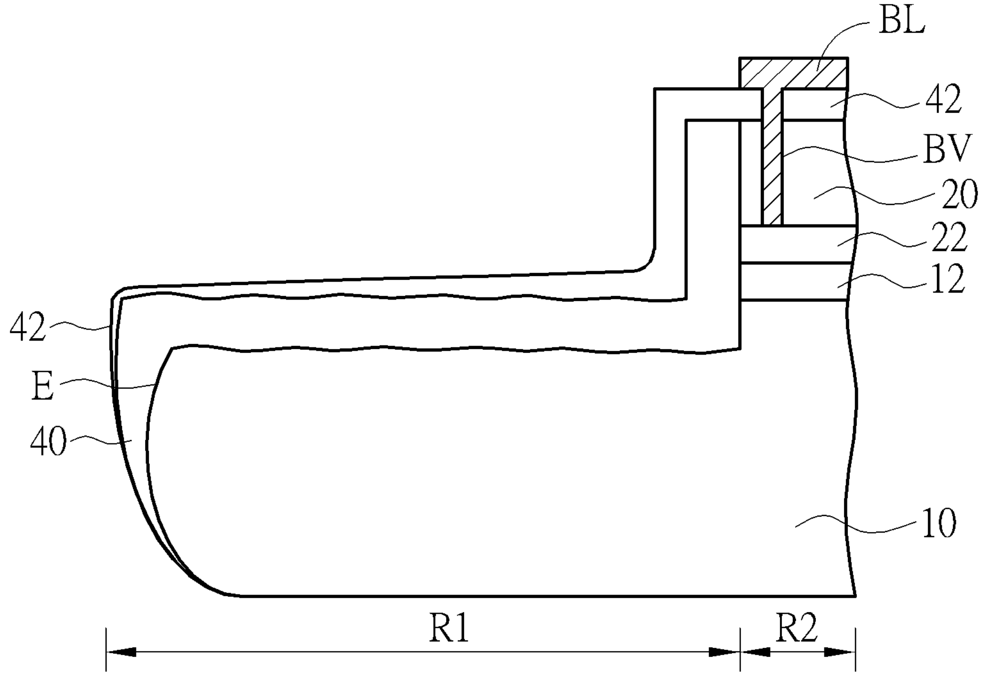
FIG. 6 is a schematic diagram showing the structure according to the structure of FIG. 5 after forming a back circuit layer to contact with the back surface.

Subsequently, as shown in FIG. 6, a back circuit layer BL and a back contact BV are formed on the second wafer 20, the back contact BV penetrates through the second material layer 42 and the second substrate 20 and is electrically connected with the first device layer 12 and the second device layer 22. The material of the back circuit layer BL and the back contact BV is, for example, metal, such as tungsten, cobalt, copper, aluminum, gold, silver, etc., but not limited thereto. The back circuit layer BL can be used to connect other conductive pads and other structures, and to connect other electronic components or signal sources. Other features belong to the known technology in this field, so these features are not described here.

Based on the above description and drawings, the present invention provides an edge structure of a semiconductor wafer, which comprises a first substrate 10, on which an edge region R1 and a device region R2 are defined, a first material layer 40 covers a first surface S1 and a side surface (i.e., the edge side surface E) of the edge region R1, and a second material layer 42 covers the first material layer 40, wherein the cross-sectional structure of the second material layer 42 gradually decreases from the device region R2 to the edge region R1

In some embodiments of the present invention, the cross-sectional structure of the second material layer 42 on the first material layer 40 is flat in the direction from the device region R2 to the edge region R1.

In some embodiments of the present invention, a device layer (i.e., the bonding structure between the first device layer 12 and the second device layer 22) is located in the device region R2 on the first substrate 10.

In some embodiments of the present invention, a second substrate 20 is further included, which is located on the device layer (the first device layer 12 and the second device layer 22).

In some embodiments of the present invention, the materials of the first substrate 10 and the second substrate 20 both contain silicon.

In some embodiments of the present invention, a thickness of the second substrate 20 is less than a thickness of the first substrate 10.

In some embodiments of the present invention, the first material layer 40 directly contacts part of a sidewall of the device layer (i.e., the bonding structure between the first device layer 12 and the second device layer 22).

In some embodiments of the present invention, the second material layer 42 further covers the second substrate 20 of the device region R2.

In some embodiments of the present invention, a top surface S1 of the first substrate 10 in the edge region R1 is lower than a top surface T1 of the first substrate 10 in the device region.

In some embodiments of the present invention, the first material layer 40 comprises a tetraethoxysilane (TEOS) layer, and the second material layer 42 comprises silicon nitride.

The invention further provides a method for manufacturing an edge structure of a semiconductor wafer, which comprises the following steps: firstly, a first substrate 10 is provided, a device region R2 and an edge region R1 are defined on the first substrate 10, and the first substrate 10 comprises a first device layer 12. A second substrate 20 is provided, the second substrate 20 comprises a second device layer 22, the first device layer 12 with the second device layer 22 are face to face bonded to each other, and an edge cutting step P2 is performed on the edge region R1, to remove part of the second substrate 20, and so as to form a first surface S1 in the edge region R1 of the first substrate 10. Afterwards, a first material layer 40 and a second material layer 42 are formed on the first surface S1, and an edge etching step P3 is performed to remove part of the second material layer 42.

In some embodiments of the present invention, the edge etching step P3 includes etching with sulfur hexafluoride ($SF_6$) and cleaning with diluted hydrofluoric acid (DHF).

In some embodiments of the present invention, the edge cutting step P2 is a physical cutting with a cutter to remove part of the first substrate 10, part of the first device layer 12 and part of the second device layer 22, and form the first surface S1.

In some embodiments of the present invention, after the first device layer 12 and the second device layer 22 are bonded, and before the edge cutting step P2, a grinding step P1 is further included to reduce the thickness of the second substrate 20.

In some embodiments of the present invention, after the edge etching step P3, a back contact BV is further formed, which penetrates through the second material layer 42 and the second substrate 20, and it is electrically connected with the second device layer 22.

In some embodiments of the present invention, a circuit layer (back circuit layer BL) is formed on the second material layer 42 and electrically connected with the back contact BV.

In some embodiments of the present invention, part of the first material layer 40 directly contacts a sidewall of the first device layer 12.

In some embodiments of the present invention, a top surface of the first surface S1 is lower than a top surface T1 of the first substrate 10 in the device region R2.

In summary, the invention is characterized in that at the edge of the bonded semiconductor structure, it is easy to break after cutting with a cutter. Therefore, the invention is characterized in that in addition to cutting the edge with a cutter, an edge etching step is additionally performed, and the edge etching step is chemically etched, so that a flatter edge contour can be formed, the probability of wafer breakage in the subsequent process can be greatly reduced, and the overall process yield can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An edge structure of a semiconductor wafer, comprising:
- a first substrate, on which an edge region and a device region are defined;
- a device layer located in the device region on the first substrate;
- a second substrate located on the device layer;
- a first material layer covers a first surface and a side surface of the edge region; and
- a second material layer covers the first material layer, wherein the cross-sectional structure of the second material layer gradually decreases from the device region to the edge region, and the second material layer further covers the second substrate of the device region.

2. The edge structure of a semiconductor wafer according to claim 1, wherein the cross-sectional structure of the second material layer on the first surface is flat in the direction from the device region to the edge region.

3. The semiconductor wafer edge structure according to claim 1, wherein the materials of the first substrate and the second substrate both comprise silicon.

4. The semiconductor wafer edge structure according to claim 1, wherein a thickness of the second substrate is smaller than a thickness of the first substrate.

5. The edge structure of semiconductor wafer according to claim 1, wherein the first material layer directly contacts part of a sidewall of the device layer.

6. The edge structure of a semiconductor wafer according to claim 1, wherein a top surface of the first substrate in the edge region is lower than a top surface of the first substrate in the device region.

7. The semiconductor wafer edge structure according to claim 1, wherein the first material layer comprises a tetraethoxysilane (TEOS) layer and the second material layer comprises a silicon nitride layer.

8. A method for manufacturing an edge structure of a semiconductor wafer, comprising:
- providing a first substrate, wherein a device region and an edge region are defined on the first substrate, and the first substrate comprises a first device layer;
- providing a second substrate, wherein the second substrate comprises a second device layer;
- bonding the first device layer with the second device layer face to face;
- performing an edge cutting step on the edge region to remove part of the second substrate and form a first surface in the edge region of the first substrate;
- forming a first material layer and a second material layer on the first surface; and
- performing an edge etching step to remove part of the second material layer, wherein after the edge etching step is performed, the cross-sectional structure of the second material layer gradually decreases in a direction from the device region to the edge region.

9. The method for manufacturing the edge structure of a semiconductor wafer according to claim 8, wherein the edge etching step comprises etching with sulfur hexafluoride ($SF_6$) and then cleaning with diluted hydrofluoric acid (DHF).

10. The method for manufacturing an edge structure of a semiconductor wafer according to claim 8, wherein the edge cutting step is a physical cutting with a cutter to remove part of the first substrate, part of the first device layer and part of the second device layer, and form the first surface.

11. The method for manufacturing the edge structure of a semiconductor wafer according to claim 8, further comprising performing a grinding step to reduce a thickness of the second substrate after bonding the first device layer with the second device layer face to face and before the edge cutting step.

12. The method for manufacturing an edge structure of a semiconductor wafer according to claim 8, wherein the first material layer comprises a tetraethoxysilane (TEOS) layer, and the second material layer comprises a silicon nitride layer.

13. The method for manufacturing an edge structure of a semiconductor wafer according to claim 8, wherein after the edge etching step, a back contact is further formed, which penetrates through the second material layer and the second substrate and is electrically connected with the second device layer.

14. The method for manufacturing an edge structure of a semiconductor wafer according to claim 13, further comprising forming a circuit layer on the second material layer and electrically connecting with the back surface.

15. The method for manufacturing an edge structure of a semiconductor wafer according to claim 8, wherein part of the first material layer directly contacts a sidewall of the first device layer.

16. The method for manufacturing an edge structure of a semiconductor wafer according to claim 8, wherein a top surface of the first substrate in the edge region is lower than a top surface of the first substrate in the device region.

* * * * *